(12) United States Patent
Huang et al.

(10) Patent No.: US 10,852,376 B2
(45) Date of Patent: Dec. 1, 2020

(54) MAGNETIC RESONANCE IMAGING METHOD AND DEVICE

(71) Applicant: Neusoft Medical Systems Co., Ltd., Liaoning (CN)

(72) Inventors: Feng Huang, Shanghai (CN); Mingliang Chen, Liaoning (CN)

(73) Assignee: Neusoft Medical Systems Co., Ltd., Liaoning (CN)

( * ) Notice: Subject to any disclaimer, the term of this patent is extended or adjusted under 35 U.S.C. 154(b) by 1 day.

(21) Appl. No.: 16/529,601

(22) Filed: Aug. 1, 2019

(65) Prior Publication Data

US 2020/0041592 A1 Feb. 6, 2020

(30) Foreign Application Priority Data

Aug. 3, 2018 (CN) .......................... 2018 1 0879064

(51) Int. Cl.
*G01R 33/48* (2006.01)
*G01R 33/561* (2006.01)
*G01R 33/56* (2006.01)

(52) U.S. Cl.
CPC ..... *G01R 33/4822* (2013.01); *G01R 33/5608* (2013.01); *G01R 33/5619* (2013.01)

(58) Field of Classification Search
CPC ............ G01R 33/4822; G01R 33/5619; G01R 33/5608; G01R 33/561; G01R 33/5611; G01R 33/4826
See application file for complete search history.

(56) References Cited

U.S. PATENT DOCUMENTS

| 7,592,808 B1 * | 9/2009 | King | G01R 33/56545 324/307 |
| 2014/0070804 A1 * | 3/2014 | Huang | G01R 33/56 324/309 |

(Continued)

FOREIGN PATENT DOCUMENTS

| CN | 103646410 A | 3/2014 |
| CN | 104434108 A | 3/2015 |

(Continued)

OTHER PUBLICATIONS

State Intellectual Property Office of the People's Republic of China, Office Action and Search Report Issued in Application No. 2018108790641, dated May 25, 2020, 15 pages, (Submitted with Machine Translation).

(Continued)

*Primary Examiner* — Susan S Lee
(74) *Attorney, Agent, or Firm* — Fish & Richardson P.C.

(57) ABSTRACT

Methods and devices for magnetic resonance imaging are provided. In one aspect, a method includes: obtaining undersampled k-space data as first partial k-space data by scanning a subject in an accelerated scanning manner, generating a first image by performing image reconstruction for the first partial k-space data according to a trained deep neural network and an explicit analytic solution imaging algorithm, obtaining mapped data of complete k-space by mapping the first image to k-space, extracting second partial k-space data from the mapped data of complete k-space, the second partial k-space data being distributed in the k-space at a same position as the first partial k-space data in the k-space, obtaining a residual image by performing image reconstruction according to the first partial k-space data and the second partial k-space data, and finally generating a magnetic (Continued)

resonance image of the subject by adding the first image with the residual image.

20 Claims, 5 Drawing Sheets

(56) References Cited

U.S. PATENT DOCUMENTS

| | | | | |
|---|---|---|---|---|
| 2019/0351261 A1* | 11/2019 | Levy | .................... | G01R 33/561 |
| 2019/0361079 A1* | 11/2019 | Takeshima | ......... | G01R 33/4818 |

FOREIGN PATENT DOCUMENTS

| | | | | |
|---|---|---|---|---|
| CN | 106970343 A | | 7/2017 | |
| CN | 107576925 A | | 1/2018 | |
| CN | 108010094 A | | 5/2018 | |
| CN | 108287324 A | | 7/2018 | |
| CN | 108324276 A | | 7/2018 | |
| CN | 108335339 A | | 7/2018 | |
| JP | 2019205542 A * | 12/2019 | ......... | G01R 33/5611 |
| WO | WO-2009027899 A2 * | 3/2009 | ....... | G01R 33/56509 |
| WO | WO-2012123921 A1 * | 9/2012 | ............. | G01R 33/56 |

OTHER PUBLICATIONS

Dongwook Lee, Jaejun Yoo, and Jong Chul Ye, "Compressed sensing and Parallel MRI using deep residual learning", ISMRM 2017, #0641.

Shanshan Wang, Ningbo Huang, Tao Zhao, Yong Yang, Leslie Ying, and Dong Liang, "1D Partial Fourier Parallel MR imaging with deep convolutional neural network", ISMRM 2017, #0642.

Enhao Gong, Greg Zaharchuk, and John Pauly, "Improving the PI+CS Reconstruction for Highly Undersampled Multi-contrast MRI using Local Deep Network", ISMRM 2017, #5663.

Hammernik K, Klatzer T, Kobler E, Recht MP, Sodickson DK, Pock T, Knoll F, "Learning a Variational Network for Reconstruction of Accelerated MRI Data". Magn Reson Med 2018.

Taejoon Eo, Yohan Jun, Taeseong Kim, Jinseong Jang, Ho-Joon Lee, Dosik Hwang, "KIKI-net: cross-domain convolutional neural networks for reconstructing undersampled magnetic resonance images". Magn Reson Med 2018.

Huang F, Chen Y, Yin W, Lin W, Ye X, Guo W, Reykowski A, "A Rapid and Robust Numerical Algorithm for Sensitivity Encoding with Sparsity Constraints: Self-feeding Sparse SENSE", Magn Reson Med 2010.

* cited by examiner

MAGNETIC RESONANCE IMAGING METHOD AND DEVICE

CROSS REFERENCE TO RELATED APPLICATIONS

This application claims priority to Chinese Patent Application No. 201810879064.1 filed on Aug. 3, 2018, the entire content of which is incorporated herein by reference.

BACKGROUND

Due to high contrast and spatial resolution for soft tissues, Magnetic Resonance Imaging (MRI) technology may obtain morphological information and functional information of an examination region at the same time and may flexibly select imaging parameters and imaging slices as required, and thus the technology becomes an important approach for current medical imaging examination.

However, the MRI has a lower imaging speed due to restrictions of factors such as Nyquist sampling theorem and the strength of a main magnetic field, thereby limiting a clinical application of the MRI.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

One aspect of the present disclosure features a magnetic resonance imaging method including: obtaining undersampled k-space data as first partial k-space data by scanning a subject in an accelerated scanning manner; generating a first image by performing image reconstruction for the first partial k-space data according to a trained first deep neural network and an explicit analytic solution imaging algorithm; obtaining mapped data of complete k-space by mapping the first image to k-space; extracting second partial k-space data from the mapped data of complete k-space, where the second partial k-space data is distributed in the k-space at a same position as the first partial k-space data in the k-space; obtaining a residual image by performing image reconstruction according to the first partial k-space data and the second partial k-space data; and generating a magnetic resonance image of the subject by adding the first image with the residual image.

In some implementations, generating the first image includes: obtaining a second image by performing partial reconstruction for the first partial k-space data with the explicit analytic solution imaging algorithm; and generating the first image by performing complete reconstruction for the second image with the first deep neural network.

In some cases, the accelerated scanning manner includes one of random undersampling and variable-density undersampling, and the explicit analytic solution imaging algorithm includes a GeneRalized Autocalibrating Partially Parallel Acquisition (GRAPPA) algorithm.

In some cases, the accelerated scanning manner includes uniform undersampling, and the explicit analytic solution imaging algorithm includes a SENSitivity Encoding (SENSE) algorithm.

In some cases, obtaining a second image by performing partial reconstruction for the first partial k-space data with the explicit analytic solution imaging algorithm includes: generating fitting data based on the first partial k-space data by using a parallel imaging algorithm; obtaining a particular partial k-space data based on the fitting data and the first partial k-space data by using a half-Fourier imaging algorithm; and generating the second image by performing the partial reconstruction based on the particular partial k-space data.

In some implementations, generating the first image includes: obtaining a second image by performing partial reconstruction for the first partial k-space data with the first deep neural network; and generating the first image by performing complete reconstruction for the second image with the explicit analytic solution imaging algorithm.

In some implementations, obtaining the residual image by performing reconstruction according to the first partial k-space data and the second partial k-space data includes: obtaining residual k-space data by subtracting the first partial k-space data from the second partial k-space data; and generating the residual image by performing sparse constraint reconstruction for the residual k-space data. Generating the residual image can include: performing the sparse constraint reconstruction for the residual k-space data in combination with a parallel imaging algorithm, with an image support domain as a regularization term.

In some implementations, obtaining mapped data of complete k-space by mapping the first image to k-space includes: obtaining the mapped data of complete k-space by mapping the first image to the k-space based on Fourier transform. Mapping the first image to the k-space based on Fourier transform can include: multiplying the first image by a coil sensitivity map of a particular channel of a multi-channel array coil that is used for scanning the subject.

In some implementations, the method further includes: obtaining a final magnetic resonance image of the subject by denoising the magnetic resonance image. Denoising the magnetic resonance image can include: denoising the magnetic resonance image with a trained second deep neural network. The trained second deep neural network can be different from the trained first deep neural network.

Another aspect of the present disclosure features a magnetic resonance imaging device, including: at least one processor and a memory configured to store machine readable instructions corresponding to a control logic for magnetic resonance imaging, where the processor is configured to read the machine readable instructions in the memory and execute the instructions to perform operations including: obtaining undersampled k-space data as a first partial k-space data by scanning a subject in an accelerated scanning manner; generating a first image by performing image reconstruction for the first partial k-space data according to a trained first deep neural network and an explicit analytic solution imaging algorithm; obtaining mapped data of complete k-space by mapping the first image to k-space; extracting second partial k-space data from the mapped data of complete k-space, where the second partial k-space data is distributed in the k-space at a same position as the first partial k-space data in the k-space; obtaining a residual image by performing image reconstruction according to the first partial k-space data and the second partial k-space data; and generating a magnetic resonance image of the subject by adding the first image with the residual image.

In some implementations, obtaining mapped data of complete k-space by mapping the first image to the k-space includes: obtaining the mapped data of complete k-space by mapping the first image to the k-space based on Fourier transform.

The operations can further include: obtaining a final magnetic resonance image of the subject by denoising the magnetic resonance image. Denoising the magnetic resonance image can include: denoising the magnetic resonance image with a trained second deep neural network that is different from the trained first deep neural network.

In some implementations, obtaining the residual image by performing reconstruction according to the first partial k-space data and the second partial k-space data includes: obtaining residual k-space data by performing subtraction for the second partial k-space data and the first partial k-space data; and generating the residual image by performing sparse constraint reconstruction for the residual k-space data.

Generating the residual image by performing sparse constraint reconstruction for the residual k-space data can include: with an image support domain as a regularization term, generating the residual image by performing the sparse constraint reconstruction for the residual k-space data in combination with a parallel imaging algorithm.

Generating the first image by performing image reconstruction for the first partial k-space data according to the trained first deep neural network and the explicit analytic solution imaging algorithm can include: obtaining a second image by performing partial reconstruction for the first partial k-space data with the explicit analytic solution imaging algorithm; and generating the first image by performing complete reconstruction for the second image with the first deep neural network.

Technical terms in the present disclosure are described as below.

An explicit analytic solution imaging method is a method of imaging by using an explicit function having an analytic solution. The explicit analytic solution imaging method may include: a parallel imaging method, a k-t Broad-use Linear Acquisition Speed-up Technique (k-t BLAST) method, a zero-padding method, and the like. Further, the parallel imaging method can include two imaging methods: a GeneRalized Autocalibrating Partially Parallel Acquisition (GRAPPA) method and a SENSitivity Encoding (SENSE) method.

A Deep Neural Network (DNN) is a method that uses multiple layers of simple functions to approximate a complicated function that is difficult to express explicitly. Parameters of the multiple layers of simple functions may be obtained by training the DNN with a training data set. Specifically, a network model capable of accurately describing a relationship between input data and a desired output result may be obtained by training the relationship according to a plurality of training samples which include the input data and the desired output results.

A DNN reconstructed image is obtained by reconstructing a magnetic resonance image based on a pre-trained DNN.

Partial reconstruction refers to that a reconstructed image is not an image reconstructed from complete k-space data, but an image reconstructed from partial k-space data. In the partial reconstruction, uncollected data may be fitted by using information of collected data. Due to the limitation of a reconstruction algorithm, only a part of uncollected data in k-space rather than all uncollected data may be fitted out by the partial reconstruction. For example, in a GRAPPA method, k-space may be set to include 256 rows of phase encoding lines, and the collected k-space data is data in the 1st, 5th, . . . , and 4n+1-th rows of phase encoding lines. In this case, after the partial reconstruction is performed, data of the 2nd, 6th, . . . , and 4n+2-th rows of phase encoding lines may be fitted, and data of the 4n+3-th and 4n+4-th rows of phase encoding lines may not be fitted. For the partial reconstruction, a part of uncollected data may be firstly fitted in k-space, and then an image is obtained by performing reconstruction according to the collected data and the fitted data. In another example, a partial image may be firstly obtained by performing reconstruction according to collected data, and then, a more complete image may be obtained by processing the partial image in an image domain in combination with other information, for example, a coil sensitivity map. The more complete image may be considered as information reflecting the collected data and the fitted data.

It is to be noted that it is required to perform image reconstruction by using a pre-trained DNN in the MRI method according to an example of the present disclosure. Therefore, it is required to train the DNN before using the DNN for image reconstruction. The DNN for reconstructing images may be referred to as a first DNN.

The first DNN may be trained with a training sample set. A training sample includes an output training sample and an input training sample. A magnetic resonance image obtained by reconstructing full sampled or enhanced full sampled k-space data is taken as the output training sample. A magnetic resonance image obtained by using specific partial k-space data may be taken as the input training sample, or the specific partial k-space data may be taken as the input training sample. The specific partial k-space data refers to a percentage of k-space data selected from the full sampled or enhanced full sampled k-space data. The output training sample is a golden standard in supervised learning for the first DNN.

To improve the reconstruction accuracy of the first DNN, the first DNN may also be trained continuously by using new training samples, so that the first DNN may be continuously updated and the quality of the image reconstruction may be improved.

A concept of the full sampled k-space data is firstly introduced. The so-called full sampled k-space data refers to data collected in all rows of phase encoding lines in a practical clinical application of MRI. For example, in the practical application of MRI, the phase encoding line is 256 rows, and the full sampled k-space data includes data in all 256 rows of phase encoding lines. An enhanced full sampled k-space data includes data in more than 256 rows of phase encoding lines, for example, data in 384 rows of phase encoding lines. The 384 rows of phase encoding lines include the above 256 rows of phase encoding lines and another 128 rows of phase encoding lines, thereby improving the resolution of the image. However, the scanning time with an enhanced full k-space sampling manner is greater than the scanning time with a full k-space sampling manner. For example, the scanning time with the enhanced full k-space sampling manner is 1.5 times or even 10 times to the scanning time with the full k-space sampling manner. In this case, a signal-to-noise (SNR) ratio and a resolution of the magnetic resonance image obtained by reconstructing for the enhanced full sampled k-space data are higher than those of the magnetic resonance image obtained by reconstructing for the full sampled k-space data. The first DNN may be trained through the training samples by a method well known to persons skilled in the art, which will not be described herein.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Figure 1:
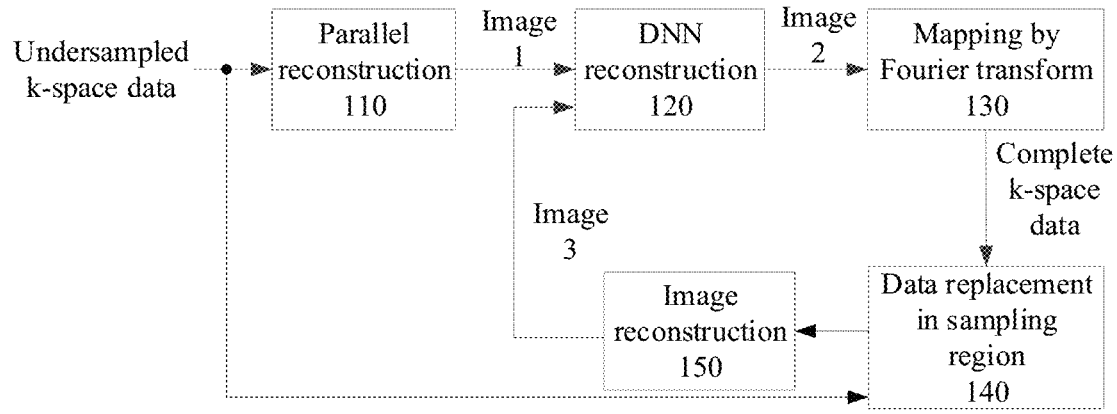
FIG. 1 is a schematic diagram illustrating magnetic resonance imaging.

To accelerate MRI, a subject may be scanned in an accelerated scanning manner. The accelerated scanning manner is an undersampling scanning manner. That is, k-space data is collected by scanning the subject in a partial sampling or downsampling manner. Scanning the subject in the undersampling manner can accelerate a magnetic resonance scanning speed and improve experiences of the subject. Thus, to increase the imaging speed of the MRI technology, undersampled k-space data may be obtained by reducing k-space data collection during an MRI scan with a parallel imaging method, and then, a magnetic resonance image may be reconstructed by using the undersampled k-space data.

In some cases, a DNN can be applied to accelerate the imaging speed. The DNN may be used to reconstruct a magnetic resonance image. The DNN is a method that uses multiple layers of simple functions to approximate a complicated function that is difficult to express explicitly. Parameters of the multiple layers of simple functions may be obtained by training the DNN with a training data set. Specifically, a network model capable of accurately describing a relationship between input data and a desired output result may be obtained by training the relationship according to a plurality of training samples which include the input data and the desired output results.

A DNN reconstructed image is obtained by reconstructing a magnetic resonance image based on a pre-trained DNN.

In the process of reconstructing a magnetic resonance image, a data fidelity term is adopted in methods of performing magnetic resonance reconstruction by using the DNN so that the reconstructed image can provide authentic and reliable diagnostic information as much as possible. The data fidelity term can be used to ensure that the reconstructed image is as approximate to the collected k-spaced data as possible.

In one method, the processing procedure of the data fidelity term is directly implemented as a part of a DNN model. This method may increase network parameters of the DNN model, so that training complexity of the DNN model can be increased and the processing time can be prolonged.

In another method, the processing procedure of the data fidelity term is implemented outside the DNN by using an iteration process. However, when the collected k-space data is less due to a higher sampling acceleration multiple, this method requires a plurality of rounds of iterations to achieve convergence, resulting in a lower reconstruction speed or poorer quality of the reconstructed image.

It can be known from the above descriptions that the data fidelity term may be processed in the following two manners in the MRI method. In the first processing manner, the data fidelity term is processed within the DNN model. In the second processing manner, the data fidelity term is implemented outside the DNN model through an iteration process.

A specific implementation of the first processing manner can be as follows: the undersampled k-space data, as the data fidelity term, is directly used as a part of the DNN reconstruction for implementing image reconstruction. In this manner, the network parameters of the DNN are increased, the training complexity of the DNN is intensified, and the processing time is prolonged.

A specific implementation of the second processing manner can be as shown in FIG. 1. Firstly, image 1 is obtained by performing parallel reconstruction (110) for the undersampled k-space data. Next, image 2 is obtained by performing DNN reconstruction (120) for the image 1. Then, complete k-space data is obtained by mapping (130) the image 2 to k-space based on Fourier transform, where the complete k-space data includes sampling region data and non-sampling region data. To ensure authenticity of the data, the sampling region data in the complete k-space is replaced (140) with the undersampled k-space data, and image 3 is obtained by performing image reconstruction (150) for the complete k-space data after replacement. Then, the image 3 is input into the DNN model to continue the DNN reconstruction (120) and perform the next iteration process. In this case, iterations will not be stopped until convergence is achieved. However, when less k-space data is collected due to a higher accelerated sampling rate (e.g., a multiple of a basic sampling rate), the method requires a plurality of rounds of iterations to achieve convergence, resulting in the lower reconstruction speed or poorer quality of the reconstructed image.

Figure 2:
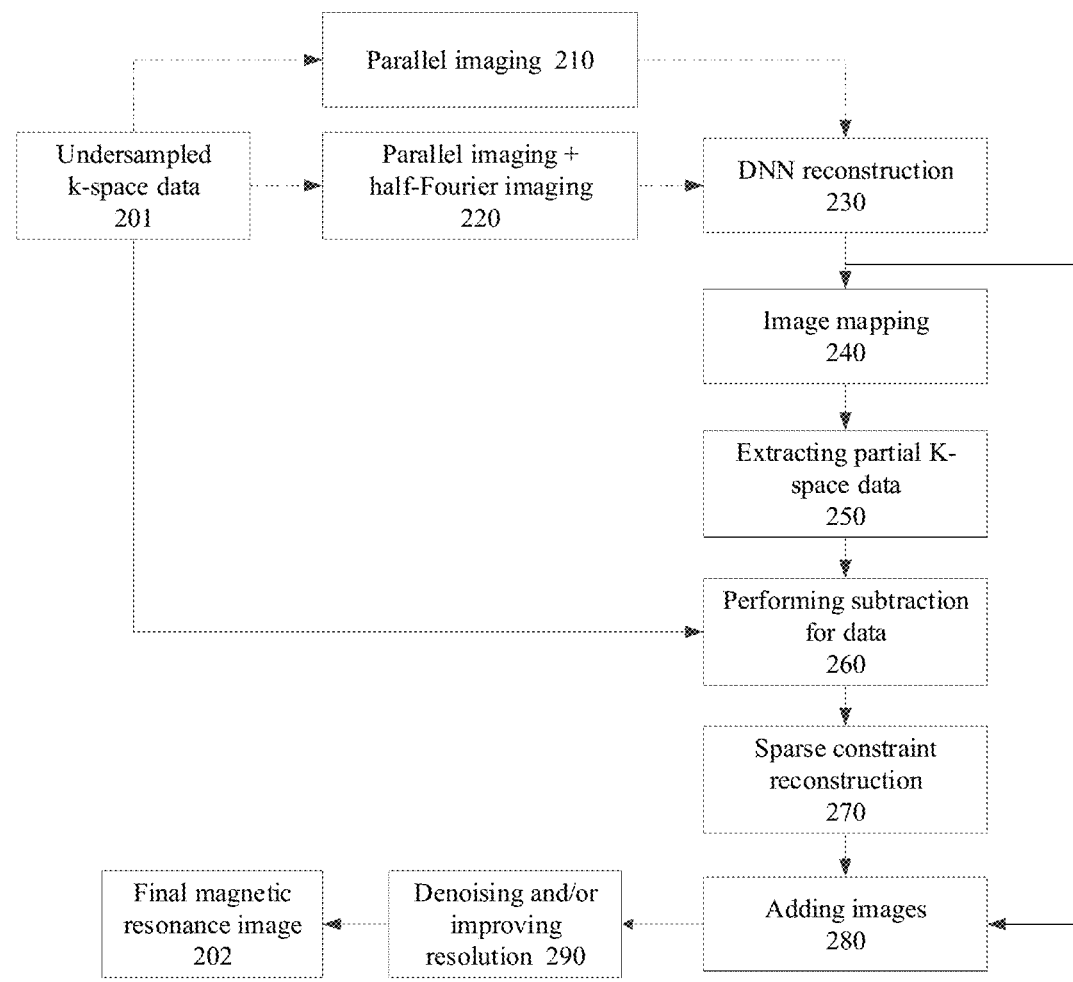
FIG. 2 is an implementation frame diagram illustrating a magnetic resonance imaging method according to an example of the present disclosure.

The present disclosure provides an MRI method addressing the above issues. An implementation frame diagram illustrating the MRI method is as shown in FIG. 2.

Firstly, undersampled k-space data (201) is obtained as first partial k-space data by scanning a subject in an accelerated scanning manner.

Next, a partially reconstructed image is obtained by performing partial reconstruction for the undersampled k-space data (201) based on parallel imaging (210) or based on parallel imaging and half-Fourier imaging (220).

A first image may be obtained after DNN reconstruction (230) is performed for the partially reconstructed image and then mapped data of complete k-space is obtained by mapping (240) the first image based on Fourier transform, where the mapped data of complete k-space includes sampling region data and non-sampling region data.

Next, second partial k-space data is extracted (250) from the mapped data, where the position of the second partial k-space data in the k-space is the same as the position of the first partial k-space data in the k-space.

Then, residual k-space data is obtained by performing subtraction (260) for the second partial k-space data and the first partial k-space data.

Next, a residual image is obtained by performing sparse constraint reconstruction (270) for the residual k-space data.

Finally, a magnetic resonance image is obtained by adding (280) the first image with the residual image.

Further, to improve the quality of a reconstructed magnetic resonance image, after the magnetic resonance image is obtained by adding the first image with the residual image, the method may further include: denoising the magnetic resonance image and/or improving the image resolution (290). After these processes, the image is taken as the finally reconstructed magnetic resonance image (202).

Both a DNN reconstruction process (230) and a process of dealing with the first partial k-space data that is a data fidelity term for the reconstructed image (270) are included in the method of the present disclosure. It can be seen from the above that the data fidelity term is processed outside the DNN model in the method. Therefore, the DNN does not need to consider the processing problem of the data fidelity term. Thus, the DNN can have low complexity and less network parameters, thereby accelerating the image reconstruction speed.

Moreover, the first image obtained by the DNN reconstruction is used to generate the residual k-space data. Information corresponding to the residual k-space data is the difference information between the second partial k-space data that is extracted from the mapped data of complete k-space obtained by mapping the first image and the first partial k-space data that is actually collected by scanning the subject. Therefore, after the sparse constraint reconstruction is performed for the residual k-space data, corresponding difference information can be reconstructed regardless of a DNN reconstruction result. Thus, the accuracy and stability of the obtained magnetic resonance image can be ensured by adding the reconstructed difference information (e.g., the residual image) with the first image. Therefore, the method can ensure that the reconstructed magnetic resonance image can have better image quality.

Furthermore, in the MRI method of the present disclosure, the processing of the data fidelity term is completed by sparse constraint reconstruction, and can be implemented without a plurality of rounds of iterations. Therefore, the method can increase the reconstruction speed on the precondition of improving the stability of the image reconstruction.

To facilitate understanding the technical solution of the present disclosure by those skilled in the art, the MRI method of the present disclosure will be further described below in detail with reference to accompanying drawings.

Figure 3:
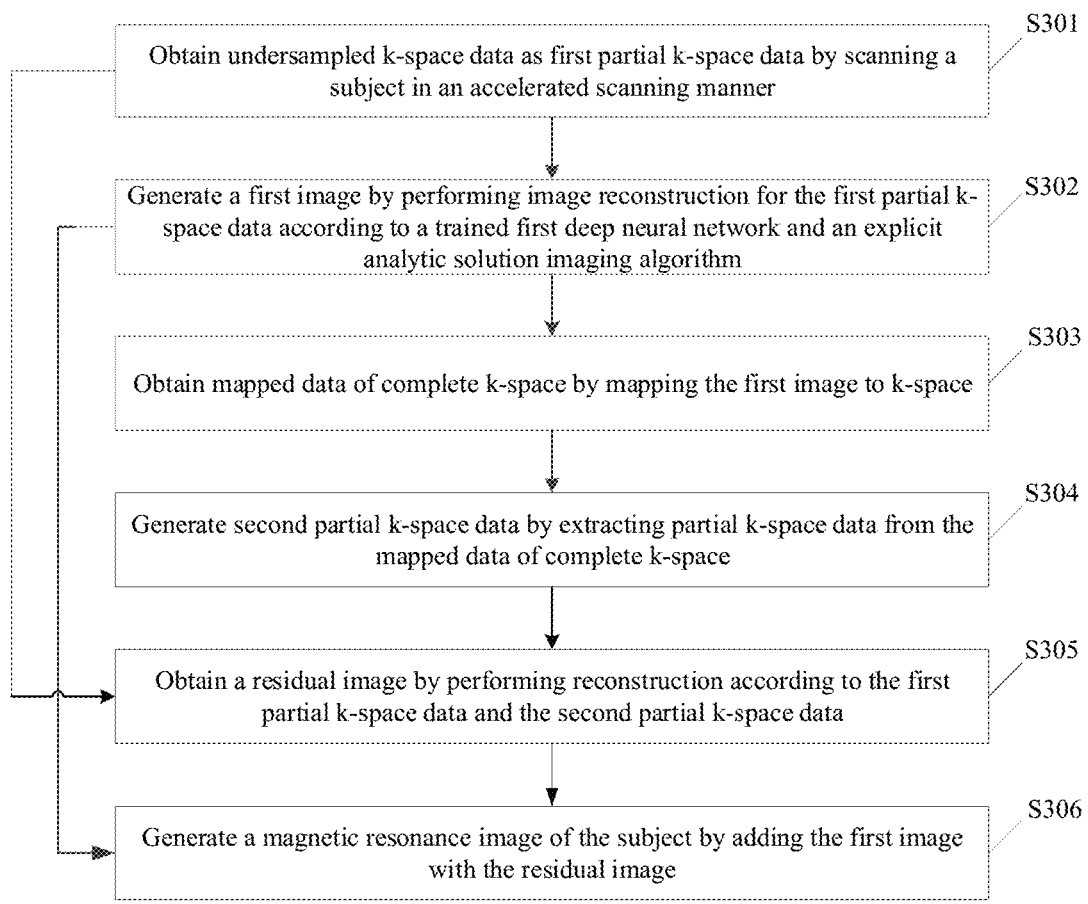
FIG. 3 is a flowchart illustrating a magnetic resonance imaging method according to an example of the present disclosure.

FIG. 3 is a flowchart illustrating an MRI method according to an example of the present disclosure. The method may include the following steps.

At step S301, undersampled first partial k-space data is obtained by scanning a subject in an accelerated scanning manner.

In this example, it is required to firstly obtain k-space data to implement MRI.

As noted above, to accelerate MRI, the subject may be scanned in the accelerated scanning manner. The accelerated scanning manner is an undersampling scanning manner. That is, the k-space data is collected by scanning the subject in a partial sampling or downsampling manner. There may be a plurality of undersampling manners, such as random undersampling, variable-density undersampling, uniform undersampling, half-Fourier undersampling, and so on. The data may be collected by using a multi-channel array coil. For the multi-channel array coil, each channel collects k-space data respectively, and the k-space data of all channels can participate in the image reconstruction process of the subsequent steps.

The uniform undersampling is taken as an example of an undersampling manner. If the sampling acceleration multiple (also referred to as an acceleration factor) is 2, an MRI system may be set to scan data once every other row, so that the number of times of phase encoding is reduced, thereby increasing the scanning speed.

The half-Fourier undersampling manner is taken as another example of an undersampling manner. The half-Fourier undersampling manner may collect data slightly more than half of the phase encoding lines, so that the scanning time is reduced by nearly half. Theoretically, the acceleration multiple is between 1 and 2. The phase encoding lines corresponding to a half-Fourier interval are scanned to obtain undersampled first partial k-space data, and the undersampled first partial k-space data may be referred as the sampling region data. The phase encoding lines other than the half-Fourier interval are not scanned, and the k-space data here may be filled with zeros, and the zeros may be referred as non-sampling region data. Therefore, the complete k-space data includes the zeros and the undersampled first partial k-space data. In an example of two-dimensional MRI, if a sampling rate of the half-Fourier sampling manner is 0.8, 80% successive phase encoding lines of the entire phase encoding lines are scanned along a phase encoding direction, and 80% of complete k-space data is obtained, the other 20% of complete k-space data may be filled with zero. The 80% of complete k-space data can be referred as the undersampling first partial k-space data. For the two-dimensional MRI, the phase encoding only exists in one direction. Therefore, partial phase encoding lines are defined in one direction of the k-space, and the undersampling first partial k-space data may be collected based on the partial phase encoding lines. In an exemplary scenario, the partial phase encoding lines may also be distributed equidistantly, distributed in a variable-density manner or distributed randomly.

Figure 7:
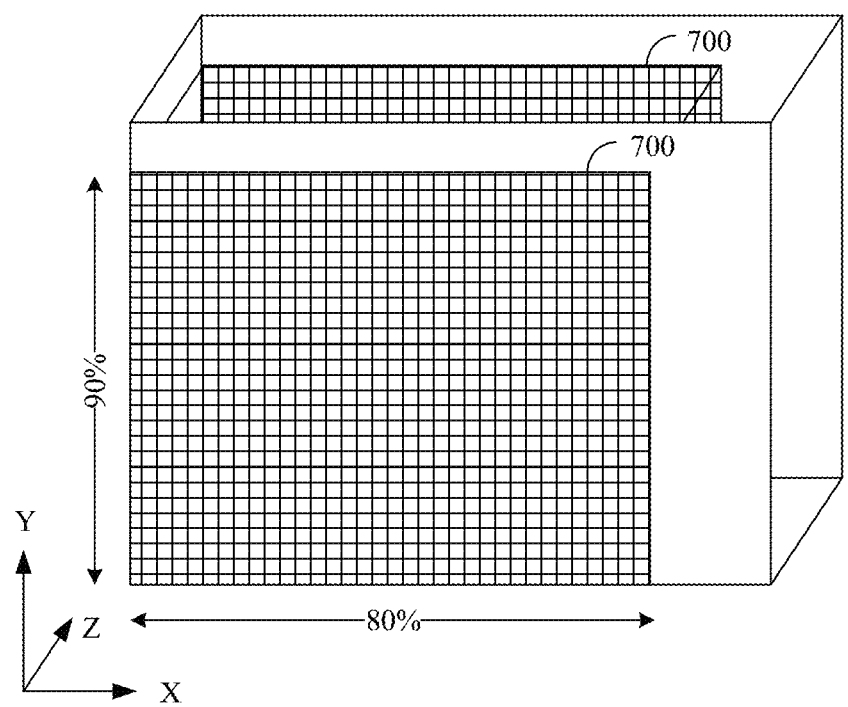
FIG. 7 is a schematic diagram illustrating half-Fourier undersampling in three-dimensional magnetic resonance imaging according to an example of the present disclosure.

In an example of three-dimensional MRI, phase encoding exists in two directions. For example, the phase encoding is performed in directions of both x-axis and y-axis. When the half-Fourier undersampling manner is used, for example, sampling rates of the half-Fourier undersampling manner are 0.8 and 0.9 respectively, 72% successive intervals within a plane formed by two phase encoding directions are taken as a sampling region. As shown in FIG. 7, the phase encoding is performed in directions of both x-axis and y-axis, frequency encoding is performed in a direction of z-axis. The sampling rate in the x-axis is 0.8, the sampling rate in the y-axis is 0.9, and the marker 700 in the drawing refers to the sampling region. The partial phase encoding lines may be defined on the plane formed by two phase encoding directions within the k-space, and the first partial k-space data may be collected based on the partial phase encoding lines.

In an example of dynamic MRI, the partial phase encoding lines may be defined within a two-dimensional or three-dimensional space formed by one or more phase encoding directions and a time dimension direction, and the first partial k-space data may be collected according to the partial phase encoding lines.

At step S302, a first image is generated by performing image reconstruction for the first partial k-space data according to a trained first DNN and an explicit analytic solution imaging algorithm.

The explicit analytic solution imaging algorithm is an algorithm of imaging by using an explicit function having an analytic solution. The explicit analytic solution imaging algorithm may include: a parallel imaging method, a k-t Broad-use Linear Acquisition Speed-up Technique (k-t BLAST) method, a zero-padding method, and the like. Further, the parallel imaging method includes two imaging methods: one method is a GeneRalized Autocalibrating Partially Parallel Acquisition (GRAPPA) method, and the other method is a SENSitivity Encoding (SENSE) method.

In the field of MRI, the explicit analytic solution imaging algorithm, for example, the parallel imaging method, is implemented based on redundant information provided by a multi-channel array coil, and the DNN is implemented based on an application of prior knowledge to reconstruct an image. Since the explicit analytic solution imaging algorithm and the DNN use different information for reconstructing an image, the two imaging methods may be used in combination to exert their respective advantages and improve the reconstructed image quality and the reconstruction speed.

Therefore, to improve the reconstructed image quality and the reconstruction speed, step S302, as an optional implementation, may specifically include the following steps.

At a first step, a second image is obtained by performing partial reconstruction for the first partial k-space data with the explicit analytic solution imaging algorithm.

Partial reconstruction refers to that a reconstructed image is not an image reconstructed from complete k-space data, but an image reconstructed from partial k-space data. In the partial reconstruction, uncollected data may be fitted by using information of collected data. Due to the limitation of a reconstruction algorithm, only a part of uncollected data in k-space rather than all uncollected data may be fitted out by the partial reconstruction. For example, in a GRAPPA method, k-space may be set to include 256 rows of phase encoding lines, and the collected k-space data is data in the 1st, 5th, . . . , and 4n+1-th rows of phase encoding lines. In this case, after the partial reconstruction is performed, data of the 2nd, 6th, . . . , and 4n+2-th rows of phase encoding lines may be fitted, and data of the 4n+3-th and 4n+4-th rows of phase encoding lines may not be fitted. For the partial reconstruction, a part of uncollected data may be firstly fitted in k-space, and then an image is obtained by performing reconstruction according to the collected data and the fitted data. In another example, a partial image may be firstly obtained by performing reconstruction according to collected data, and then, a more complete image may be obtained by processing the partial image in an image domain in combination with other information, for example, a coil sensitivity map. The more complete image may be considered as information reflecting the collected data and the fitted data.

The partial k-space data may be obtained in a plurality of undersampling manners, and the k-space data obtained in different undersampling manners may have different data features. Therefore, to obtain a better image reconstruction effect, different explicit analytic solution imaging algorithms may be adopted for different undersampling manners.

In an example, when the first partial k-space data is obtained in a random undersampling manner or a variable-density undersampling manner, the second image may be obtained by performing partial reconstruction for the first partial k-space data with a GRAPPA method at this step.

In another example, when the first partial k-space data is obtained in a uniform undersampling manner, the second image may be obtained by performing partial reconstruction for the first partial k-space data with a SENSE method.

At the first step, the partial reconstruction is performed for the first partial k-space data by the explicit analytic solution imaging algorithm. One of the methods for increasing a scanning speed of the MRI is to reduce the number of phase encoding lines, that is, to use a larger acceleration multiple, for example, 4 times. However, the larger acceleration multiple will result in poor quality of the magnetic resonance image reconstructed by the explicit analytic solution imaging algorithm. Therefore, the partial reconstruction may be firstly performed by the explicit analytic solution imaging algorithm at the first step. For example, if the data amount of the first partial k-space data is 25% of the complete k-space data amount, the partial reconstruction may be performed by using a data amount equivalent to 60%.

At a second step, the first image is generated by performing complete reconstruction for the second image with the first DNN.

This step may specifically include: inputting the second image into the first DNN, performing complete reconstruction for the second image by using the first DNN, and taking an output image of the first DNN as the first image.

In a specific implementation of step S302, the image reconstruction is completed by using the combination of the DNN and the explicit analytic solution imaging algorithm. Further, to exert advantages of the explicit analytic solution imaging algorithm and the DNN image reconstruction method, a part of image reconstruction process may be completed by the explicit analytic solution imaging algorithm, and the remaining part of image reconstruction process may be completed by the DNN image reconstruction method. For example, the second image can be reconstructed by the explicit analytic solution imaging algorithm for the first partial k-space data collected with an undersampling manner, and then, the first image can be reconstructed by using the DNN for the second image.

More specifically, when the explicit analytic solution imaging algorithm includes a parallel imaging method and a half-Fourier imaging method, the image reconstruction may also be implemented in combination with the half-Fourier imaging method to reduce the influence on image quality during the MRI. To exert respective advantages of the parallel imaging method, the half-Fourier image reconstruction method, and the first DNN image reconstruction method, a part of image reconstruction process may be firstly completed by using the parallel imaging method and the half-Fourier imaging method, and then, the remaining part of image reconstruction process may be completed by using the DNN image reconstruction method. The above example may specifically be implemented as follows: the first partial k-space data is 20% of complete k-space data, and other 20% of the complete k-space data is fitted by using the parallel imaging method based on the first partial k-space data; then, 50% of the complete k-space data is obtained by using 40% of the complete k-space data with the half-Fourier method, where the 40% of the complete k-space data includes the fitted data and the first partial k-space data; a second image is generated according to the 50% of the complete k-space data; finally, the second image is passed through the first DNN to reconstruct the first image. The first image is reconstructed by using k-space data equivalent to 100%.

Before using the first DNN at step S302, it is required to pre-train the first DNN. The first DNN may be trained with a training sample set. A training sample includes an output training sample and an input training sample. A magnetic resonance image obtained by reconstructing full sampled or enhanced full sampled k-space data is taken as the output training sample. A magnetic resonance image obtained by using specific partial k-space data may be taken as the input training sample, or the specific partial k-space data may be taken as the input training sample. The specific partial k-space data refers to a percentage of k-space data selected from the full sampled or enhanced full sampled k-space data. The output training sample is a golden standard in supervised learning for the first DNN.

A concept of the full sampled k-space data is firstly introduced. The so-called full sampled k-space data refers to data collected in all rows of phase encoding lines in a practical clinical application of MRI. For example, in the practical application of MRI, the phase encoding line is 256 rows, and the full sampled k-space data includes data in all 256 rows of phase encoding lines. The enhanced full sampled k-space data includes data in more than 256 rows of phase encoding lines, for example, data in 384 rows of phase encoding lines. The 384 rows of phase encoding lines include the above 256 rows of phase encoding lines and another 128 rows of phase encoding lines, thereby improving the resolution of the image. However, the scanning time with an enhanced full k-space sampling manner is greater than the scanning time with a full k-space sampling manner. For example, the scanning time with the enhanced full k-space sampling manner is 1.5 times or even 10 times to the scanning time with the full k-space sampling manner. In this case, a signal-to-noise ratio and a resolution of the magnetic resonance image obtained by reconstructing for the enhanced full sampled k-space data are higher than those of the magnetic resonance image obtained by reconstructing for the full sampled k-space data. The first DNN may be trained through the training samples by a method well known to persons skilled in the art, which will not be described herein.

To improve the reconstruction accuracy of the first DNN, the first DNN may also be trained continuously by using new training samples, so that the first DNN may be continuously updated and the quality of the image reconstruction may be improved.

In the above implementation of step S302, the second image is firstly obtained by performing partial reconstruction for the first partial k-space data with the explicit analytic solution imaging algorithm, and then, the first image is obtained by performing complete reconstruction for the second image with the first DNN. As another optional example of step S302, the partial reconstruction may be firstly performed for the first partial k-space data by using a DNN, and then, the complete reconstruction may be performed for the partially reconstructed image by an explicit analytic solution imaging algorithm. In this case, the DNN may be referred to as a third DNN. It is to be noted that the third DNN is different from the first DNN in specific architecture. It is required to train the third DNN separately rather than directly use network parameters of the first DNN.

At step S303, mapped data of complete k-space is obtained by mapping the first image to k-space.

It can be seen from step S302 that the first image is reconstructed by using the k-space data equivalent to 100% after image reconstruction is performed according to the explicit analytic solution imaging algorithm and the first DNN. Therefore, the mapped data of complete k-space may be obtained by mapping the first image.

In an implementation of step S303, to improve the fidelity of the subsequently reconstructed magnetic resonance image, the mapped data of complete k-space may be obtained by mapping the first image to k-space by Fourier transform at step S303.

The first image may be mapped to k-space by Fourier transform as follows: Fourier transform may be performed for a product obtained by multiplying the first image by a coil sensitivity map of a particular channel, and the transformed data is the k-space data of the particular channel of the multi-channel array coil, that is, the mapped data of complete k-space for the particular channel.

The complete k-space includes a sampling region and a non-sampling region. The mapped data of complete k-space includes data mapped after the image reconstruction is performed with the first DNN and the explicit analytic solution imaging algorithm.

At step S304, second partial k-space data is generated by extracting partial k-space data from the mapped data of complete k-space.

To subsequently process the k-space data as the data fidelity term, the step may specifically include: obtaining the second partial k-space data by extracting the mapped k-space data in the sampling region of complete k-space. The second partial k-space data is distributed in k-space at the same position as the first partial k-space data in k-space.

For example, the undersampling manner is set to the uniform undersampling manner, the acceleration multiple is 4, the k-space includes 256 rows of phase encoding lines, and the first partial k-space data is data in the 1st, 5th, . . . , and 4n+1-th rows of phase encoding lines. Correspondingly, at step S304, it is required to obtain the second partial k-space data by extracting the data in the 1st, 5th, . . . , and 4n+1-th rows of phase encoding lines from the above mapped data of complete k-space.

At step S305, a residual image is obtained by performing reconstruction according to the first partial k-space data and the second partial k-space data.

In an example, to improve the reconstruction speed and the reconstruction quality of the residual image, step S305 may specifically include the followings.

Firstly, residual k-space data is obtained by performing subtraction for the second partial k-space data and the first partial k-space data.

It is to be noted that the second partial k-space data is data obtained by mapping the first image generated by performing image reconstruction with a trained first DNN and an explicit analytic solution imaging algorithm, and the first partial k-space data is actual collected data. Therefore, there may be differences between the second partial k-space data and the first partial k-space data. To ensure the authenticity of an image obtained by subsequent reconstruction, the residual k-space data may be obtained by subtracting the first partial k-space data from the second partial k-space data at this step.

For example, the second partial k-space data refers as A, the first partial k-space data refers as B, and the residual k-space data refers as C, then C=A−B.

It is to be noted that features of the residual k-space data are related to the reconstruction results of the first image. When the first image reconstructed by the first DNN and the explicit analytic solution imaging algorithm is approximate to a real image, the residual k-space data is sparse; when the first image deviates from the real image, the residual k-space data is dense.

Next, the residual image is generated by performing sparse constraint reconstruction for the residual k-space data.

To fully use information such as an image support domain, collected k-space data and a coil sensitivity map, the step may specifically include: with an image support domain as a regularization term, generating the residual image by performing sparse constraint reconstruction for the residual k-space data in combination with a parallel imaging method. In an example, the sparse constraint reconstruction may be performed according to the following formula:

$$m = \|E\hat{I} - \tilde{K}\|^2 + \frac{\alpha}{QBC}\|\hat{I}\|^2$$

where, E refers to a magnetic resonance signal encoding operator, $\hat{I}$ refers to the residual image, $\tilde{K}$ refers to the residual k-space data previously obtained by calculation, $E\hat{I}$ refers to performing Fourier transform for the residual image $\hat{I}$ to map the residual image to k-space, $\|E\hat{I}-\tilde{K}\|^2$ refers to a data coincidence term, $\|\hat{I}\|^2$ refers to an energy constraint term, $\alpha$ refers to a non-negative parameter used for balancing the data coincidence term and the energy constraint term, and QBC refers to the image support domain.

During the sparse constraint reconstruction, a corresponding value $\hat{I}$ is obtained by minimizing m.

The image support domain may be an image reconstructed for k-space data collected by a Quadrature Body Coil (QBC). A valid image region may be determined according to the image support domain. That is, an image contour corresponding to a scanning subject may be determined according to the image support domain. Before a formal high-resolution scan is performed at step S301, data of the QBC and the multi-channel array coil may be collected respectively by performing a low-resolution pre-scan for the subject. The image support domain and the coil sensitivity map for each channel of the multi-channel array coil may be generated by reconstructing for the data obtained in the pre-scan.

In this example, the residual image is obtained by performing image reconstruction for the residual k-space data based on the sparse constraint reconstruction method. When the first image is approximate to the real image, the residual k-space data is sparse, and the residual image subjected to sparse constraint reconstruction has a higher signal-to-noise ratio. When the first image deviates from the real image, the residual k-space data is dense, and the residual image subjected to sparse constraint reconstruction does not have a higher signal-to-noise ratio at this time, but the authenticity of the image can be guaranteed.

At step S306, a magnetic resonance image of the subject is generated by adding the first image with the residual image.

In this example, when the residual image subjected to sparse constraint reconstruction has a higher signal-to-noise ratio, the magnetic resonance image obtained by adding the first image with the residual image also has a higher signal-to-noise ratio, thereby providing a high-quality magnetic resonance image and more diagnosis information for a doctor. In this case, the doctor can accurately diagnose a lesion of a patient. When the residual image subjected to sparse constraint reconstruction can reflect the authenticity of the image, the authenticity of the magnetic resonance image obtained by adding the first image with the residual image can be guaranteed.

The above descriptions are specific implementations of the MRI method according to an example of the present disclosure. According to the MRI method in this example, after a first image is reconstructed by first DNN and an explicit analytic solution imaging algorithm, second partial k-space data is extracted from mapped data of complete k-space to which the first image is mapped, and residual k-space data is obtained by performing subtraction for first partial k-space data and the second partial k-space data; then, a residual image is obtained by performing sparse constraint reconstruction for the residual k-space data; finally, a magnetic resonance image is obtained by adding the first image with the residual image.

Therefore, in this method, the actually-collected first partial k-space data is used in the processing operation performed after reconstructing the first image, where the first partial k-space data is the data fidelity term. In this method, the data fidelity term is processed outside the DNN, that is, the first DNN does not need to consider the processing problem of the data fidelity term. The first DNN has low complexity and less network parameters, thereby accelerating the image reconstruction speed.

In addition, in an example of the present disclosure, the first image obtained by the first DNN reconstruction is used to generate residual k-space data. Information corresponding to the residual k-space data reflects difference information between the second partial k-space data obtained by mapping the first image and the actually-collected k-space data. Therefore, after the sparse constraint reconstruction is performed, corresponding difference information will be reconstructed regardless of the result of the first DNN reconstruction. The accuracy and stability of the obtained magnetic resonance image can be ensured by adding the reconstructed difference information (e.g., the residual image) with the first image reconstructed by the first DNN. Therefore, the method can ensure that the reconstructed magnetic resonance image provides real diagnostic information.

In addition, in the MRI method of the present disclosure, the processing of the data fidelity term is completed by sparse constraint reconstruction, and can be implemented without a plurality of rounds of iterations. Therefore, the method can increase the reconstruction speed on the precondition of improving the stability of the image reconstruction.

In an optional implementation of the above MRI, after the magnetic resonance image is obtained by adding the first image with the residual image, obtaining a final magnetic resonance image of the subject by denoising the magnetic resonance image may also be included to improve the image quality, for example, to reduce the noise of the magnetic resonance image and improve the resolution of the magnetic resonance image.

Denoising may be performed by a DNN because the DNN has advantages in super-resolution, denoising, and the like.

In an optional implementation of this step, the final magnetic resonance image may be obtained by denoising the magnetic resonance image with a second DNN. The second DNN is a trained network that may denoise an input image.

In a practical application, the magnetic resonance image obtained at step S306 may be used as an input of the second DNN and processed by the second DNN to generate the final magnetic resonance image. In this way, the noise of the magnetic resonance image may be reduced, the resolution of the magnetic resonance image may be improved, thereby improving the quality of the final magnetic resonance image.

It is to be noted that the first DNN and the second DNN are different DNNs in the examples of the present disclosure.

To verify the effect of the MRI method according to an example of the present disclosure, the following comparison test results are obtained in the example of the present disclosure. For the comparison test results, data of an 8-channel head coil is collected, and a sampling manner is a combination of uniform undersampling and half-Fourier undersampling. The sampling acceleration multiple of uniform undersampling is 4, half-Fourier collects 72% of data in complete k-space, resulting in a total acceleration multiple of 5.5. Magnetic resonance images are reconstructed respectively for the k-space data obtained in this sampling manner based on different image reconstruction methods as shown in FIGS. 4B to 4D.

Figure 4A:
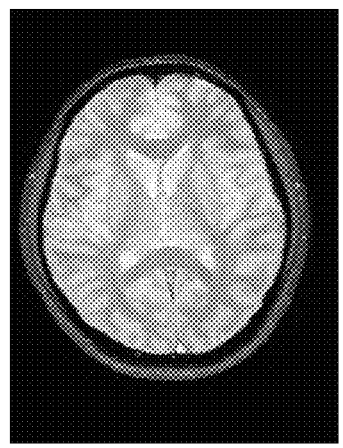
FIGS. 4A to 4D are schematic diagrams illustrating a comparison of effects of magnetic resonance imaging methods.
Figure 4B:
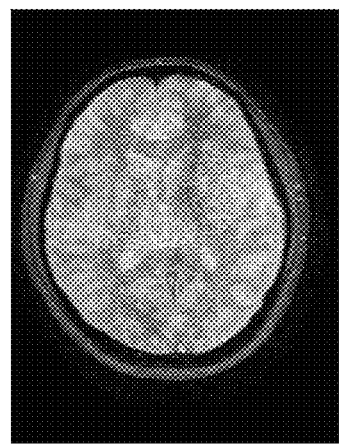
Figure 4C:
Figure 4D:

FIG. 4A illustrates an image reconstructed for data collected in a full sampling manner, and FIG. 4A may be taken as a reference image. FIG. 4B illustrates an image reconstructed by using a parallel imaging method and a half-Fourier imaging method. FIG. 4C illustrates an image reconstructed by using only a DNN. FIG. 4D illustrates an image obtained by the imaging method of the present disclosure. It can be seen from the drawings that the image obtained by the present disclosure has a reduced noise compared with the image (FIG. 4B) reconstructed by the traditional parallel and the half-Fourier imaging method. It can be seen from the drawings that the image obtained by the present disclosure has improved sharpness compared with the image (FIG. 4C) reconstructed by using the DNN without the data fidelity term, and the image obtained by the present disclosure is more real and natural.

Figure 5:
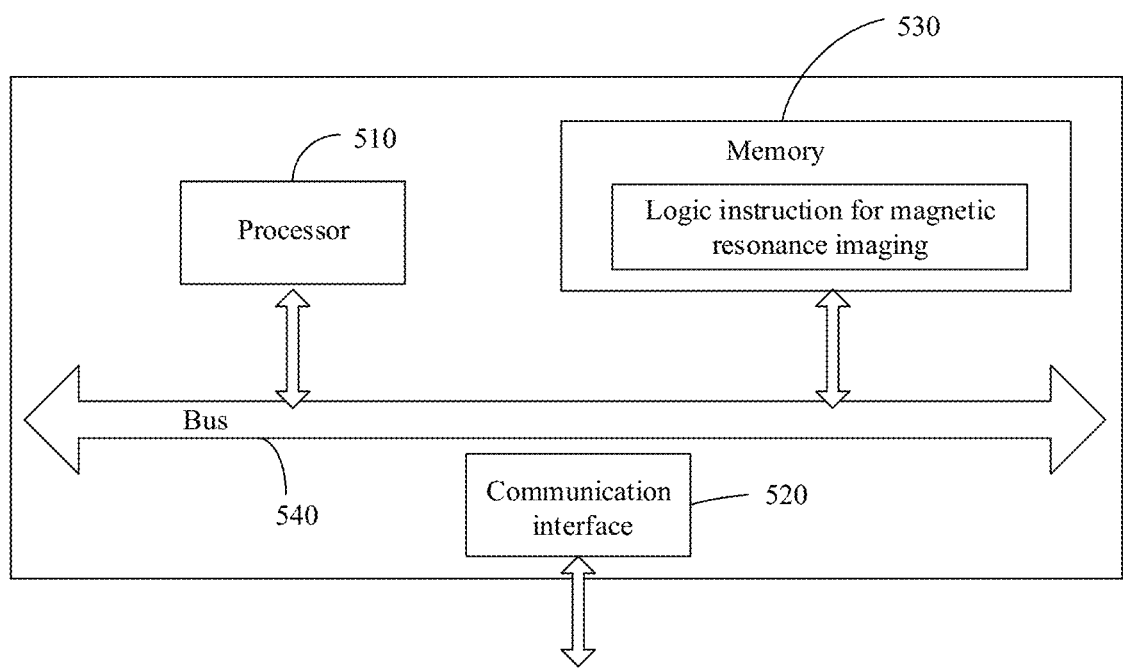
FIG. 5 is a block diagram of a magnetic resonance imaging device according to an example of the present disclosure.

The MRI method according to the above examples may be executed by an MRI device shown in FIG. 5. The device shown in FIG. 5 includes at least one processor 510, a communications interface 520, a memory 530 and a bus 540. The processor 510, the communications interface 520 and the memory 530 communicate with each other through the bus 540.

An MRI system may include components such as an examination bed, a magnet, gradient coils, a radio-frequency transmitting coil, a radio-frequency receiving coil, a gradient amplifier, a radio-frequency controller and a host computer. The host computer is responsible for sending an MRI sequence, calculating collected radio-frequency data, reconstructing and displaying a magnetic resonance image, and the like. The MRI device shown in FIG. 5 may be located in the host computer in the MRI system.

The memory 530 may store logical instructions for MRI. The memory may be, for example, a non-volatile memory. In an example, the logical instructions for MRI may be a program corresponding to a control software. When the processor executes the instructions, the device may correspondingly display a function interface corresponding to the instructions on a display interface. The processor 510 may invoke and execute the logical instruction for MRI in the memory 530 to execute the following operations of: obtaining undersampled first partial k-space data by scanning a subject in an accelerated scanning manner; generating a first image by performing image reconstruction for the first partial k-space data according to a trained first deep neural network and an explicit analytic solution imaging algorithm; obtaining mapped data of complete k-space by mapping the first image to k-space; generating second partial k-space data by extracting partial k-space data from the mapped data of complete k-space, wherein the second partial k-space data is distributed in k-space at the same position as the first partial k-space data in k-space; obtaining a residual image by performing reconstruction according to the first partial k-space data and the second partial k-space data; and generating a magnetic resonance image of the subject by adding the first image with the residual image.

In an example, obtaining mapped data of complete k-space by mapping the first image to k-space includes: obtaining mapped data of complete k-space by mapping the first image to k-space based on Fourier transform.

In an example, the processor 510 may further invoke and execute the logical instruction for MRI in the memory 530 to execute the following operations of: obtaining a final magnetic resonance image of the subject by denoising the magnetic resonance image.

In an example, denoising the magnetic resonance image includes: obtaining the final magnetic resonance image by denoising the magnetic resonance image with a trained second deep neural network.

In an example, obtaining the residual image by performing reconstruction according to the first partial k-space data and the second partial k-space data includes: obtaining residual k-space data by performing subtraction for the second partial k-space data and the first partial k-space data; and generating the residual image by performing sparse constraint reconstruction for the residual k-space data.

In an example, generating the residual image by performing sparse constraint reconstruction for the residual k-space data includes: with an image support domain as a regularization term, generating the residual image by performing sparse constraint reconstruction for the residual k-space data in combination with a parallel imaging method.

In an example, generating the first image by performing image reconstruction for the first partial k-space data according to the trained first deep neural network and the explicit analytic solution imaging algorithm includes: obtaining a second image by performing partial reconstruction for the first partial k-space data with the explicit analytic solution imaging algorithm; and generating the first image by performing complete reconstruction for the second image with the first deep neural network.

The functions of the logical instructions for MRI, if implemented in the form of software function units and sold or used as independent products, may be stored in a machine-readable storage medium. Based on such understanding, the technical solution of the present disclosure essentially or a part contributing to the prior art or part of the technical solution may be embodied in the form of a software product. The software product is stored in a storage medium, and includes several instructions for enabling a computer device (such as a personal computer, a server or a host computer in MRI system) to execute all or part of the steps of the method in the examples of the present disclosure. The above storage mediums include various mediums such as a USB flash disk, a mobile hard disk, a Read-Only Memory (ROM), a magnetic disk or a compact disk, and the like, which may store program codes.

The above logical instructions for MRI may be divided into different functional modules, which may be specifically referred to the following example.

Figure 6:
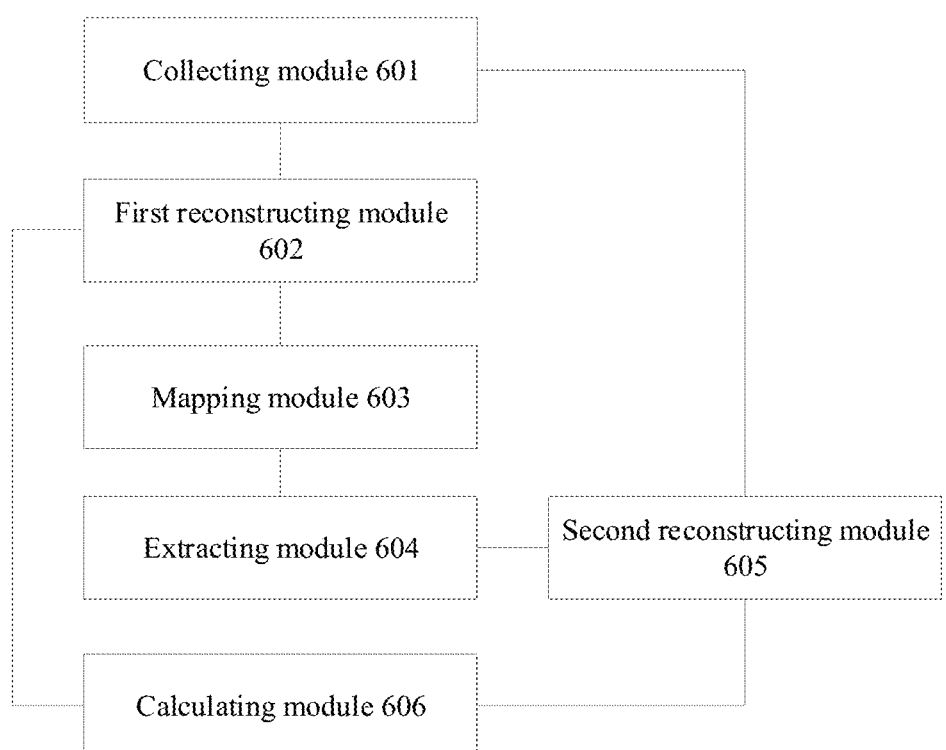
FIG. 6 is a schematic diagram illustrating a functional structure of a magnetic resonance imaging device according to an example of the present disclosure.

A specific implementation of the MRI device according to an example of the present disclosure will be described below in combination with accompanying drawings. FIG. 6 illustrates a functional structure of a magnetic resonance imaging device according to an example of the present disclosure. The functional structure of the device includes a collecting module 601, a first reconstructing module 602, a mapping module 603, an extracting module 604, a second reconstructing module 605, and a calculating module 606.

The collecting module 601, configured to obtain undersampled first partial k-space data by scanning a subject in an accelerated scanning manner.

The first reconstructing unit 602, configured to generate a first image by performing image reconstruction for the first partial k-space data according to a trained first deep neural network and an explicit analytic solution imaging algorithm.

The mapping unit 603, configured to obtain mapped data of complete k-space by mapping the first image to k-space.

The extracting unit 604, configured to generate second partial k-space data by extracting partial k-space data from the mapped data of complete k-space, where the second partial k-space data is distributed in k-space at the same position as the first partial k-space data in k-space.

The second reconstructing unit 605, configured to obtain a residual image by performing reconstruction according to the first partial k-space data and the second partial k-space data.

The calculating unit 606, configured to generate a magnetic resonance image of the subject by adding the first image with the residual image.

It is to be noted that specific implementations and functions of different modules or units in the example may be referred to the method shown in FIG. 3, which will not be described herein.

According to the MRI device in this example, after a first image is reconstructed by first DNN and an explicit analytic solution imaging algorithm, second partial k-space data is extracted from mapped data of complete k-space to which the first image is mapped, and residual k-space data is obtained by performing subtraction for first partial k-space data and the second partial k-space data; then, a residual image is obtained by performing sparse constraint reconstruction for the residual k-space data; finally, a magnetic resonance image is obtained by adding the first image with the residual image. Therefore, in the device, the actually-collected first partial k-space data is used in the processing operation performed after reconstructing the first image, where the first partial k-space data is the data fidelity term. The data fidelity term is processed outside the DNN, that is, the first DNN does not need to consider the processing problem of the data fidelity term. The first DNN has low complexity and less network parameters, thereby accelerating the image reconstruction speed.

In addition, in the example of the present disclosure, since the first image obtained by the first DNN reconstruction is used to generate residual k-space data, the first image will not affect the authenticity of the finally reconstructed magnetic resonance image. Therefore, the method can ensure that the reconstructed magnetic resonance image provides real diagnostic information. In addition, in the MRI device of the present disclosure, the processing of the data fidelity term is completed by sparse constraint reconstruction, and can be implemented without a plurality of rounds of iterations. Therefore, the method can increase the reconstruction speed on the precondition of improving the stability of the image reconstruction.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A magnetic resonance imaging method comprising:
    obtaining undersampled k-space data as first partial k-space data by scanning a subject in an accelerated scanning manner;
    generating a first image by performing image reconstruction for the first partial k-space data according to a trained first deep neural network and an explicit analytic solution imaging algorithm;
    obtaining mapped data of complete k-space by mapping the first image to k-space;
    extracting second partial k-space data from the mapped data of complete k-space, wherein the second partial k-space data is distributed in the k-space at a same position as the first partial k-space data in the k-space;
    obtaining a residual image by performing image reconstruction according to the first partial k-space data and the second partial k-space data; and
    generating a magnetic resonance image of the subject by adding the first image with the residual image.

2. The method of claim 1, wherein generating the first image comprises:
    obtaining a second image by performing partial reconstruction for the first partial k-space data with the explicit analytic solution imaging algorithm; and
    generating the first image by performing complete reconstruction for the second image with the first deep neural network.

3. The method of claim 2, wherein the accelerated scanning manner comprises one of random undersampling and variable-density undersampling, and
    wherein the explicit analytic solution imaging algorithm comprises a GeneRalized Autocalibrating Partially Parallel Acquisition (GRAPPA) algorithm.

4. The method of claim 2, wherein the accelerated scanning manner comprises uniform undersampling, and
    wherein the explicit analytic solution imaging algorithm comprises a SENSitivity Encoding (SENSE) algorithm.

5. The method of claim 2, wherein obtaining a second image by performing partial reconstruction for the first partial k-space data with the explicit analytic solution imaging algorithm comprises:

generating fitting data based on the first partial k-space data by using a parallel imaging algorithm;
obtaining a particular partial k-space data based on the fitting data and the first partial k-space data by using a half-Fourier imaging algorithm; and
generating the second image by performing the partial reconstruction based on the particular partial k-space data.

6. The method of claim 1, wherein generating the first image comprises:
obtaining a second image by performing partial reconstruction for the first partial k-space data with the first deep neural network; and
generating the first image by performing complete reconstruction for the second image with the explicit analytic solution imaging algorithm.

7. The method of claim 1, wherein obtaining the residual image by performing reconstruction according to the first partial k-space data and the second partial k-space data comprises:
obtaining residual k-space data by subtracting the first partial k-space data from the second partial k-space data; and
generating the residual image by performing sparse constraint reconstruction for the residual k-space data.

8. The method of claim 7, wherein generating the residual image comprises:
performing the sparse constraint reconstruction for the residual k-space data in combination with a parallel imaging algorithm, with an image support domain as a regularization term.

9. The method of claim 1, wherein obtaining mapped data of complete k-space by mapping the first image to k-space comprises:
obtaining the mapped data of complete k-space by mapping the first image to the k-space based on Fourier transform.

10. The method of claim 9, wherein mapping the first image to the k-space based on Fourier transform comprises:
multiplying the first image by a coil sensitivity map of a particular channel of a multi-channel array coil that is used for scanning the subject.

11. The method of claim 1, further comprising:
obtaining a final magnetic resonance image of the subject by denoising the magnetic resonance image.

12. The method of claim 11, wherein denoising the magnetic resonance image comprises:
denoising the magnetic resonance image with a trained second deep neural network.

13. The method of claim 12, wherein the trained second deep neural network is different from the trained first deep neural network.

14. A magnetic resonance imaging device, comprising:
at least one processor; and
a memory configured to store machine readable instructions corresponding to a control logic for magnetic resonance imaging;
wherein the processor is configured to read the machine readable instructions in the memory and execute the instructions to perform operations comprising:
obtaining undersampled k-space data as a first partial k-space data by scanning a subject in an accelerated scanning manner;
generating a first image by performing image reconstruction for the first partial k-space data according to a trained first deep neural network and an explicit analytic solution imaging algorithm;
obtaining mapped data of complete k-space by mapping the first image to k-space;
extracting second partial k-space data from the mapped data of complete k-space, wherein the second partial k-space data is distributed in the k-space at a same position as the first partial k-space data in the k-space;
obtaining a residual image by performing image reconstruction according to the first partial k-space data and the second partial k-space data; and
generating a magnetic resonance image of the subject by adding the first image with the residual image.

15. The device of claim 14, wherein obtaining mapped data of complete k-space by mapping the first image to the k-space comprises:
obtaining the mapped data of complete k-space by mapping the first image to the k-space based on Fourier transform.

16. The device of claim 14, wherein the operations further comprises:
obtaining a final magnetic resonance image of the subject by denoising the magnetic resonance image.

17. The device of claim 16, wherein denoising the magnetic resonance image comprises:
denoising the magnetic resonance image with a trained second deep neural network that is different from the trained first deep neural network.

18. The device of claim 14, wherein obtaining the residual image by performing reconstruction according to the first partial k-space data and the second partial k-space data comprises:
obtaining residual k-space data by performing subtraction for the second partial k-space data and the first partial k-space data; and
generating the residual image by performing sparse constraint reconstruction for the residual k-space data.

19. The device of claim 18, wherein generating the residual image by performing sparse constraint reconstruction for the residual k-space data comprises:
with an image support domain as a regularization term, generating the residual image by performing the sparse constraint reconstruction for the residual k-space data in combination with a parallel imaging algorithm.

20. The device of claim 14, wherein generating the first image by performing image reconstruction for the first partial k-space data according to the trained first deep neural network and the explicit analytic solution imaging algorithm comprises:
obtaining a second image by performing partial reconstruction for the first partial k-space data with the explicit analytic solution imaging algorithm; and
generating the first image by performing complete reconstruction for the second image with the first deep neural network.

* * * * *